United States Patent
Kimura

(10) Patent No.: US 8,401,701 B2
(45) Date of Patent: Mar. 19, 2013

(54) SUBSTRATE TRANSFER ROBOT, SUBSTRATE TRANSFER APPARATUS INCLUDING THE SAME, AND SEMICONDUCTOR MANUFACTURING APPARATUS INCLUDING THE SAME

(75) Inventor: Yoshiki Kimura, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 738 days.

(21) Appl. No.: 12/560,423

(22) Filed: Sep. 16, 2009

(65) Prior Publication Data

US 2010/0161124 A1    Jun. 24, 2010

(30) Foreign Application Priority Data

Dec. 18, 2008   (JP) .................................. 2008-322481
Jun. 17, 2009   (JP) .................................. 2009-144281

(51) Int. Cl.
G05B 19/04     (2006.01)
G05B 19/18     (2006.01)

(52) U.S. Cl. ..... 700/251; 700/245; 318/567; 318/568.1; 318/568.11; 318/568.12; 318/568.16; 318/568.19; 318/568.21

(58) Field of Classification Search .................. 700/245, 700/251; 901/2, 14, 31, 46; 318/567, 568.1, 318/568.11, 568.12, 568.16, 568.19, 568.21
See application file for complete search history.

(56) References Cited

U.S. PATENT DOCUMENTS

| | | | | |
|---|---|---|---|---|
| 5,657,235 A | * | 8/1997 | Liebmann et al. | 700/182 |
| 5,668,733 A | * | 9/1997 | Morimoto et al. | 414/222.13 |
| 6,282,459 B1 | * | 8/2001 | Ballantine et al. | 700/245 |
| 6,438,458 B2 | * | 8/2002 | Shimoike et al. | 700/250 |
| 6,643,563 B2 | * | 11/2003 | Hosek et al. | 700/245 |
| 6,643,564 B2 | * | 11/2003 | Kataoka et al. | 700/258 |
| 6,813,543 B2 | * | 11/2004 | Aalund et al. | 700/245 |
| 7,497,912 B2 | * | 3/2009 | Koyama et al. | 118/719 |
| 7,684,895 B2 | * | 3/2010 | Rice et al. | 700/245 |
| 2003/0108415 A1 | * | 6/2003 | Hosek et al. | 414/783 |
| 2004/0031779 A1 | * | 2/2004 | Cahill et al. | 219/121.83 |
| 2005/0061248 A1 | * | 3/2005 | Koyama et al. | 118/719 |
| 2006/0045719 A1 | * | 3/2006 | Bacchi et al. | 414/744.5 |

FOREIGN PATENT DOCUMENTS

JP    2000-174092    6/2000
JP    2000174092 A  *  6/2000

* cited by examiner

*Primary Examiner* — Khoi Tran
*Assistant Examiner* — Jamie Figueroa
(74) *Attorney, Agent, or Firm* — Ditthavong Mori & Steiner, P.C.

(57) ABSTRACT

A substrate transfer robot sets an interference region in advance in the range of motion of the substrate transfer robot; stores a plurality of patterns of a combination of a starting position, a target position, and the interference region, the starting position and the target position being among taught positions; determines which pattern among the plurality of patterns a movement of the substrate transfer robot from the starting position to the target position matches when the substrate transfer robot moves between the plurality of taught positions; and determines a movement path from the starting position to the target position so as to avoid the interference region in accordance with the determined pattern so that the substrate transfer robot avoids the interference region.

14 Claims, 22 Drawing Sheets

Fig. 1A
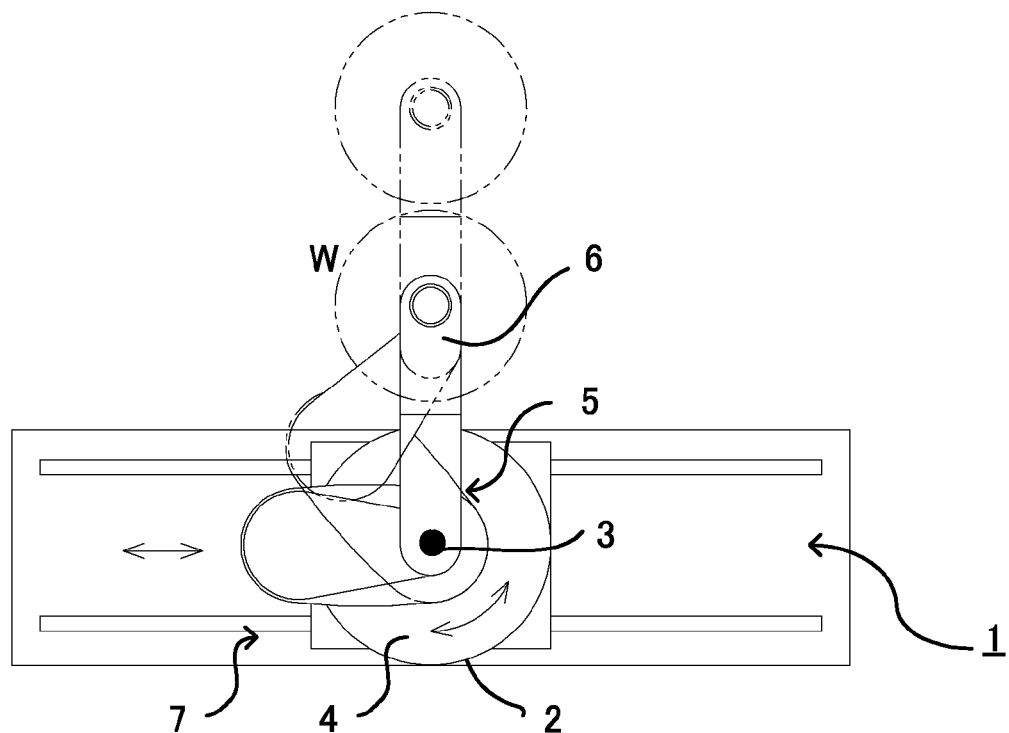
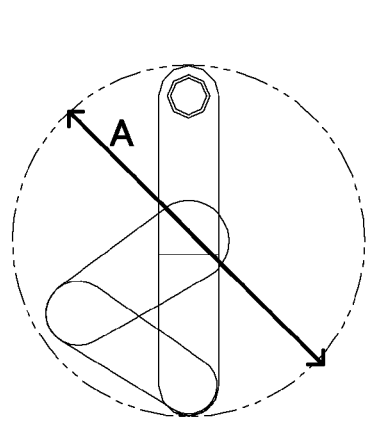
Fig. 1B
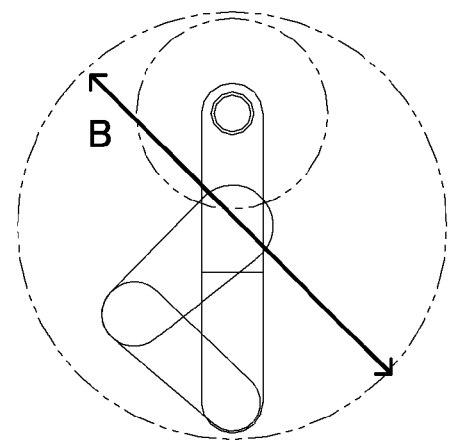
Fig. 1C (1)-1 EXAMPLE IN WHICH TARGET REGION IS ON X-AXIS BOUNDARY LINE OF INTERFERENCE REGION AND STARTING REGION IS ON Y-AXIS BOUNDARY LINE OF INTERFERENCE REGION (1)-1 EXAMPLE IN WHICH TARGET REGION IS ON X-AXIS BOUNDARY LINE OF INTERFERENCE REGION AND STARTING REGION IS ON Y-AXIS BOUNDARY LINE OF INTERFERENCE REGION (1)-2 EXAMPLE IN WHICH STARTING REGION IS ON X-AXIS BOUNDARY LINE OF INTERFERENCE REGION AND TARGET REGION IS ON Y-AXIS BOUNDARY LINE OF INTERFERENCE REGION (1)-2 EXAMPLE IN WHICH STARTING REGION IS ON X-AXIS BOUNDARY LINE OF INTERFERENCE REGION AND TARGET REGION IS ON Y-AXIS BOUNDARY LINE OF INTERFERENCE REGION (2)-1 EXAMPLE IN WHICH STARTING REGION AND TARGET REGION ARE ON X-AXIS BOUNDARY LINES OF INTERFERENCE REGION (2)-1 EXAMPLE IN WHICH STARTING REGION AND TARGET REGION ARE ON X-AXIS BOUNDARY LINES OF INTERFERENCE REGION

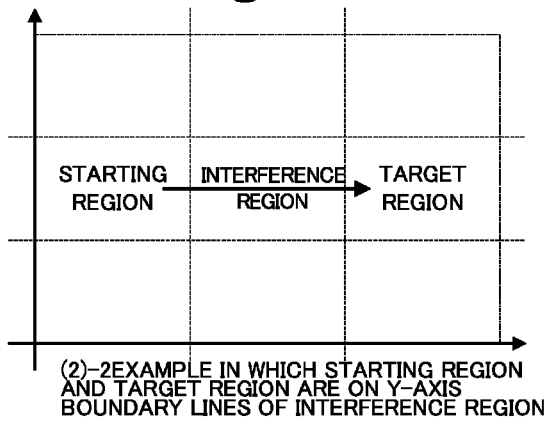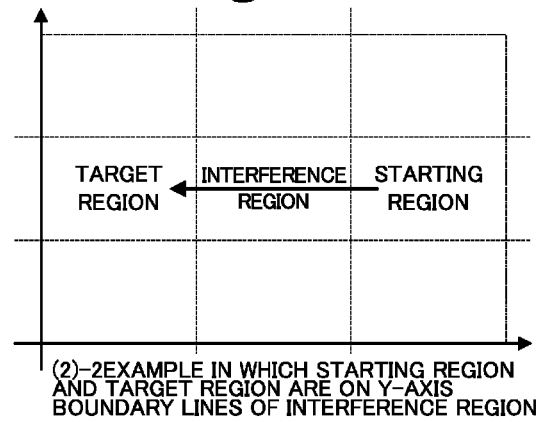

(3)EXAMPLE IN WHICH STARTING REGION AND TARGET REGION ARE ON EXTENSION OF DIAGONAL LINE OF INTERFERENCE REGION (3)EXAMPLE IN WHICH STARTING REGION AND TARGET REGION ARE ON EXTENSION OF DIAGONAL LINE OF INTERFERENCE REGION (3)EXAMPLE IN WHICH STARTING REGION AND TARGET REGION ARE ON EXTENSION OF DIAGONAL LINE OF INTERFERENCE REGION (3)EXAMPLE IN WHICH STARTING REGION AND TARGET REGION ARE ON EXTENSION OF DIAGONAL LINE OF INTERFERENCE REGION (4)EXAMPLE IN WHICH STARTING REGION AND TARGET REGION ARE ON OPPOSITE BOUNDARY LINES OF DIFFERENT INTERFERENCE REGIONS (4)EXAMPLE IN WHICH STARTING REGION AND TARGET REGION ARE ON OPPOSITE BOUNDARY LINES OF DIFFERENT INTERFERENCE REGIONS

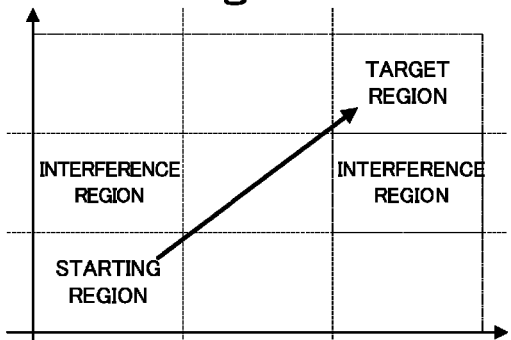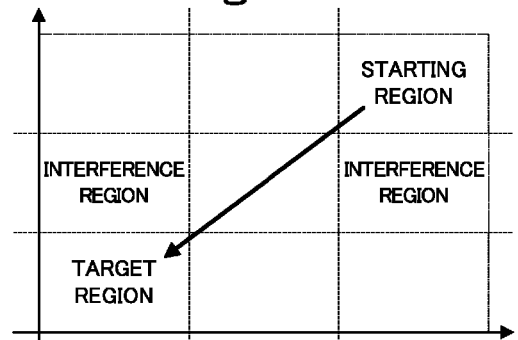
Fig. 9C
(4) EXAMPLE IN WHICH STARTING REGION AND TARGET REGION ARE ON OPPOSITE BOUNDARY LINES OF DIFFERENT INTERFERENCE REGIONS
Fig. 9D
(4) EXAMPLE IN WHICH STARTING REGION AND TARGET REGION ARE ON OPPOSITE BOUNDARY LINES OF DIFFERENT INTERFERENCE REGIONS BASIC PATH(1)-a BASIC PATH(1)-b BASIC PATH(1)-c BASIC PATH(1)-d BASIC PATH(2)-a BASIC PATH(2)-b BASIC PATH(2)-c BASIC PATH(2)-d BASIC PATH(3)-a BASIC PATH(3)-b

Fig. 13C

| X COORDINATE OF STARTING POSITION < X COORDINATE OF TARGET POSITION  Y COORDINATE OF STARTING POSITION < Y COORDINATE OF TARGET POSITION | X COORDINATE OF STARTING POSITION < X COORDINATE OF TARGET POSITION  Y COORDINATE OF STARTING POSITION > Y COORDINATE OF TARGET POSITION | X COORDINATE OF STARTING POSITION > X COORDINATE OF TARGET POSITION  Y COORDINATE OF STARTING POSITION < Y COORDINATE OF TARGET POSITION | X COORDINATE OF STARTING POSITION > X COORDINATE OF TARGET POSITION  Y COORDINATE OF STARTING POSITION > Y COORDINATE OF TARGET POSITION |
|---|---|---|---|
| DRIVE AXIS CORRESPONDING TO X-AXIS → DRIVE AXIS CORRESPONDING TO Y-AXIS | DRIVE AXIS CORRESPONDING TO Y-AXIS → DRIVE AXIS CORRESPONDING TO X-AXIS | DRIVE AXIS CORRESPONDING TO X-AXIS → DRIVE AXIS CORRESPONDING TO Y-AXIS | DRIVE AXIS CORRESPONDING TO Y-AXIS → DRIVE AXIS CORRESPONDING TO X-AXIS |

DRIVING ORDERS-1

Fig. 13D

| X COORDINATE OF STARTING POSITION < X COORDINATE OF TARGET POSITION<br>Y COORDINATE OF STARTING POSITION < Y COORDINATE OF TARGET POSITION | X COORDINATE OF STARTING POSITION < X COORDINATE OF TARGET POSITION<br>Y COORDINATE OF STARTING POSITION > Y COORDINATE OF TARGET POSITION | X COORDINATE OF STARTING POSITION > X COORDINATE OF TARGET POSITION<br>Y COORDINATE OF STARTING POSITION < Y COORDINATE OF TARGET POSITION | X COORDINATE OF STARTING POSITION > X COORDINATE OF TARGET POSITION<br>Y COORDINATE OF STARTING POSITION > Y COORDINATE OF TARGET POSITION |
|---|---|---|---|
| DRIVE AXIS CORRESPONDING TO Y-AXIS → DRIVE AXIS CORRESPONDING TO X-AXIS | DRIVE AXIS CORRESPONDING TO X-AXIS → DRIVE AXIS CORRESPONDING TO Y-AXIS | DRIVE AXIS CORRESPONDING TO Y-AXIS → DRIVE AXIS CORRESPONDING TO X-AXIS | DRIVE AXIS CORRESPONDING TO X-AXIS → DRIVE AXIS CORRESPONDING TO Y-AXIS |

DRIVING ORDERS-2

Fig. 13E

| IF (DISTANCE BETWEEN STARTING POSITION AND DIAGONAL LINE L >= DISTANCE BETWEEN TARGET POSITION AND DIAGONAL LINE L) | IF (DISTANCE BETWEEN STARTING POSITION AND DIAGONAL LINE L < DISTANCE BETWEEN TARGET POSITION AND DIAGONAL LINE L) |
|---|---|
| IF STARTING POSITION IS ABOVE DIAGONAL LINE L: THE SAME AS DRIVING ORDERS-2 | IF STARTING POSITION IS ABOVE DIAGONAL LINE L: THE SAME AS DRIVING ORDERS-1 |
| IF STARTING POSITION IS BELOW DIAGONAL LINE L: THE SAME AS DRIVING ORDERS-1 | IF STARTING POSITION IS BELOW DIAGONAL LINE L: THE SAME AS DRIVING ORDERS-2 |

DRIVING ORDERS-3

BASIC PATH(4)-a

BASIC PATH(4)-b

SUBSTRATE TRANSFER ROBOT, SUBSTRATE TRANSFER APPARATUS INCLUDING THE SAME, AND SEMICONDUCTOR MANUFACTURING APPARATUS INCLUDING THE SAME

CROSS REFERENCES TO RELATED APPLICATIONS

The present application contains subject matter related to that disclosed in Japanese Priority Patent Applications JP 2008-322481 and JP 2009-144281 respectively filed in the Japan Patent Office on Dec. 18, 2008 and Jun. 17, 2009, the entire contents of which is hereby incorporated by reference.

BACKGROUND OF THE INVENTION

1. Field of the Invention

The present invention relates to a function of a substrate transfer robot for avoiding interference within the range of motion thereof, the substrate transfer robot being used for a manufacturing apparatus or a testing apparatus for semiconductor devices or liquid crystal display devices.

2. Description of the Related Art

Substrate transfer robots have been used for manufacturing apparatuses and testing apparatuses for semiconductor devices and liquid crystal display devices (hereinafter referred to as semiconductor manufacturing apparatuses) in order to transfer substrates such as semiconductor wafers, masks, and liquid crystal glass to predetermined positions.

Such substrate transfer robots are capable of transferring substrates to taught positions that have been taught beforehand. A substrate transfer robot can move to a target position with the smallest distance and in the shortest time by moving in a straight line connecting a starting position and the target position of the movement. However, because semiconductor manufacturing apparatuses have been made smaller so as to save space, the range of motion of a substrate transfer robot has become limited. Thus, when an obstacle is disposed in the range of motion, the substrate transfer robot may not be able to move in a straight line.

Against such a background, for example, an apparatus disclosed in Japanese Unexamined Patent Application Publication No. 2000-174092 avoids interference by setting an interference region representing an obstacle in the range of motion of the substrate transfer robot and by generating a path that avoids the interference region if the substrate transfer robot is to make a movement that might pass through the interference region.

The apparatus disclosed in Japanese Unexamined Patent Application Publication No. 2000-174092 avoids interference approximately in the following manner. First, region critical points (vertices) between an interference region and a non-interference region are set, and a plurality of zones are generated using the region critical points. Next, the equation of a straight line that connects the starting position and the target position of a movement is calculated. By comparing the equation of the straight line and the region critical points in zones including the starting position and the target position, whether the straight line interferes with the interference region (whether the line passes through the interference region) is determined. If there be an interference, a path that goes through vicinities of the region critical points is generated so as to avoid interference.

However, the interference avoidance process of Japanese Unexamined Patent Application Publication No. 2000-174092 has the following problem. In determining whether the straight line connecting the starting position and the target position interferes with the interference region, region critical points that exist between the zones including the starting position and the target position are extracted and the coordinates of the region critical points are compared with the equation of the straight line. Therefore, when a large number of region critical points are extracted, the determination becomes complex and time consuming.

Moreover, in most cases, a substrate transfer robot requires a larger range of motion when a hand of the robot holds a substrate than when the robot does not hold a substrate. However, the interference avoidance process according to Japanese Unexamined Patent Application Publication No. 2000-174092 generates an interference avoidance path irrespective of whether the hand holds a substrate. Therefore, a path generated by the process may not be the shortest path between the two points, which does not enable the substrate transfer robot to move between the points within the shortest time.

SUMMARY OF THE INVENTION

In accordance with an aspect of the present invention, a substrate transfer robot has a hand for holding a substrate and is movable between a plurality of taught positions that have been taught beforehand so as to transfer the substrate. The substrate transfer robot stores a plurality of patterns of a combination of a starting position, a target position, and an interference region that has been set in advance; determines which pattern among the plurality of patterns a movement of the substrate transfer robot from the starting position to the target position matches when the substrate transfer robot moves between the plurality of taught positions; and performs an avoidance movement in accordance with the pattern that has been determined.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A to 1C are plan views showing the structure of a substrate transfer robot according to an embodiment of the present invention;

FIGS. 7A to 7D show examples of a pattern of a starting position, a target position, and an interference region in the imaginary coordinate plane;

FIGS. 9A to 9C show examples of a pattern of a starting position, a target position, and an interference region in the imaginary coordinate plane;

FIGS. 13A to 13E show a process of generating a path of an interference avoidance movement according to the embodiment of the present invention;

DETAILED DESCRIPTION OF THE PREFERRED EMBODIMENTS

Figure 2:
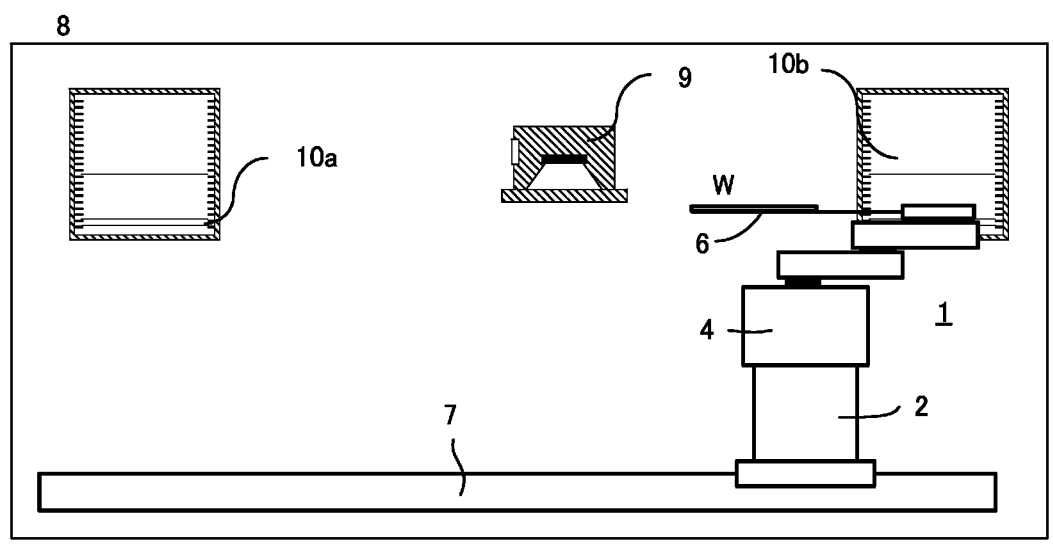
FIG. 2 is a side view showing a layout of a semiconductor manufacturing apparatus utilizing the substrate transfer robot shown in FIG. 1.

Embodiments will now be described with reference to the accompanying drawings, wherein like reference numerals designate corresponding or identical elements throughout the various drawings.

First Embodiment

FIG. 1A is a plan view showing a substrate transfer robot having an interference avoidance function according to an embodiment of the present invention.

FIG. 1A to 1C show a substrate transfer robot 1 and a substrate W to be transferred. The substrate transfer robot 1 includes a column 2 serving as a base, a mount base 4 that can be vertically elevated on the column 2, an arm unit 5 rotatably attached to the mount base 4, and a hand 6 attached to an end of the arm unit 5. In the present embodiment, the hand 6 holds the substrate W by applying suction to a back surface of the substrate W. Whether the hand 6 appropriately applies suction and holds the substrate W is checked from a pressure of the suction mechanism. Alternatively, the hand 6 may have a sensor (not shown) that detects whether the hand 6 holds the substrate W. As long as whether the hand 6 holds the substrate W is detectable, the hand 6 may hold the substrate W by applying suction to the substrate W or by mechanically gripping the substrate W.

The arm unit 5 includes two or three arms connected with each other, which can be rotated with respect to each other by a motor (not shown). One of the arms at a base end is connected to the mount base 4. The entire arm unit 5 is rotatable around a center axis 3.

As shown in FIG. 1B, when the substrate transfer robot 1 contracts the arm unit 5 in a radial direction of a circle centered at the center axis 3 and rotates around the center axis 3, if the hand 6 does not hold the substrate W, the range within a diameter A is a required minimum range. As shown in FIG. 1C, if the hand 6 holds the substrate W, the range within a diameter B is a required minimum range. The term "minimum rotation diameter" refers to a diameter that is necessary for the arm unit 5 to rotate two-dimensionally. As necessary, the minimum rotation diameter when the hand 6 does not hold the substrate W is referred to as the "minimum rotation diameter without a substrate", and the minimum rotation diameter when the hand 6 holds the substrate W is referred to as the "minimum rotation diameter with a substrate".

The column 2 is connected to a travel unit 7 so that the substrate transfer robot 1 can move in the left-right direction of FIG. 1A. The travel unit 7 includes a linear motor, ball screw, or the like.

With the above-described structure, the substrate transfer robot 1 at least has an elevation axis for vertically driving the arm unit 5, a travel axis for linearly moving the column 2, an extension axis for horizontally contracting the arm unit 5 and the hand 6, and a rotation axis for rotating the arm unit 5 and the hand 6 around the center axis 3.

The substrate transfer robot 1 is connected to a controller (not shown) that stores taught positions. The substrate transfer robot 1 transfers the substrate W along a transfer path generated from the taught positions stored in the controller.

FIG. 2 is a side view showing a transfer apparatus 8, which is included in a semiconductor manufacturing apparatus, utilizing the substrate transfer robot 1 shown in FIGS. 1A to 1C. A substrate cleaning apparatus (not shown), for example, is disposed adjacent to the transfer apparatus 8. The substrate transfer robot 1 of the transfer apparatus 8 transfers a substrate from a substrate container 10 (described below) to the cleaning apparatus.

The substrate transfer robot 1 is disposed inside the transfer apparatus 8. In the middle portion of a wall of the transfer apparatus 8, an obstacle 9 is disposed within the range of motion of the substrate transfer robot 1. The transfer apparatus 8 includes two substrate containers 10a and 10b. The substrate transfer robot 1 is configured to approach the substrate containers 10a and 10b by driving the travel unit 7, extend the arm unit 5, make the hand 6 access the inside of the substrate container 10, and transfer/receive the substrate W. The obstacle 9 is disposed at a position at which the obstacle 9 interferes at least with the arm unit 5 when the arm unit 5 is traveling along the travel axis driven by the travel unit 7 at a height greater than a certain value. In this case, unless the arm unit 5 is lowered to a height smaller than a certain value along the elevation axis, interference with the obstacle 9 cannot be avoided.

An interference avoidance function according to the present embodiment is described. The interference avoidance function refers to a function of the substrate transfer robot 1 for avoiding interference with an obstacle, such as the obstacle 9, disposed within the range of motion of the substrate transfer robot 1. This function checks whether an interference region defined in a coordinate plane interferes with a projection of the substrate transfer robot 1 on the coordinate plane. An interference avoidance function using the travel axis and the elevation axis is described below as an example.

Figure 3:
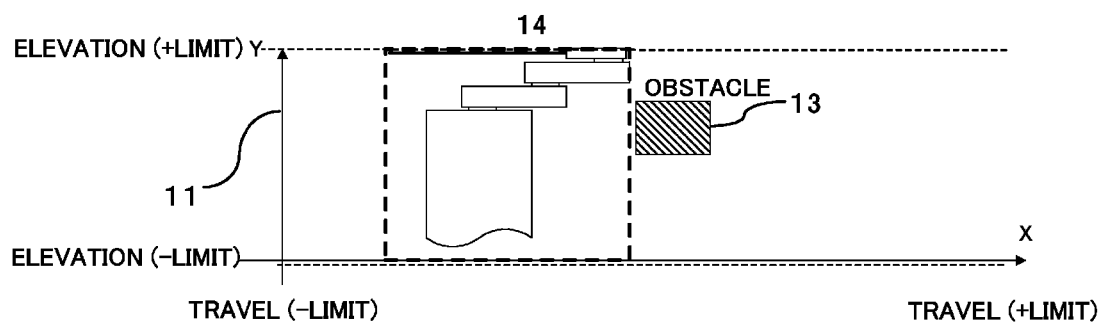
FIG. 3 shows a relationship between the substrate transfer robot and an imaginary coordinate plane.

With the function, an interference region is first generated in a coordinate plane. FIG. 3 illustrates a method of generating an interference region for the transfer apparatus 8 shown in FIG. 2. An imaginary coordinate plane 11 has coordinate axes that are projections of the elevation axis and the travel axis. The imaginary coordinate plane 11 has an X-axis corresponding to the travel axis with a travel coordinate and a Y-axis corresponding to the elevation axis with an elevation coordinate. A projected obstacle 13 and a projected substrate transfer robot 14 are projections of the obstacle 9 and the substrate transfer robot 1 shown in FIG. 2 on the imaginary coordinate plane 11.

With this function, a state in which the projected obstacle 13 overlaps the projected substrate transfer robot 14 is determined as an interference state. An interference region 12, which is defined by the overlapping region, is used to check the interference state. To be specific, the interference region 12 is generated as follows.

First, projections of the obstacle and the substrate transfer robot, which have complex shapes, are changed with rectangular regions. This is because defining of the interference region and checking of an interference state become difficult, if the projections have complex shapes. By extracting a part of an object most widely projected in the direction of each axis, a projected region is defined as a rectangular region including the entire shape of a projection. For the projected substrate transfer robot 14 shown in FIG. 3, the arm unit 5 is the part most widely projected in the X direction. That is, the width of the rectangle region is either the minimum rotation diameter with a substrate or the minimum rotation diameter without a substrate of the substrate transfer robot 1. Regarding the Y direction, the height of the rectangular region is determined from the movement range of the elevation axis of the substrate transfer robot.

Figure 4:
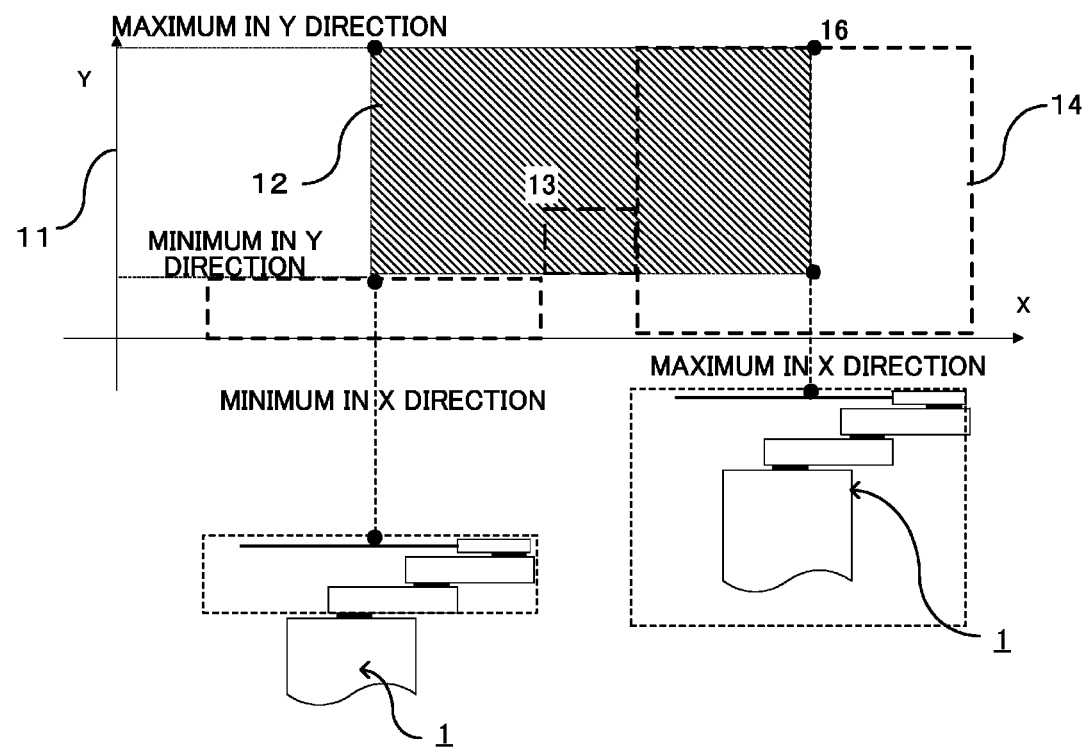
FIG. 4 shows interference between the substrate transfer robot and an obstacle by using the imaginary coordinate plane.

Next, the coordinates of points at which the projected obstacle and the projected substrate transfer robot contact each other are determined. The coordinates of the points at which the projected regions contact each other are determined from the coordinates of the points of the projected obstacle 13, which are constant, and the coordinates for the elevation axis and the travel axis of the projected substrate transfer robot 14, which are variable. FIG. 4 shows a state in which the projected obstacle 13 contacts the projected substrate transfer robot 14. As shown in FIG. 4, the interference region 12 is the range surrounded by four positions of a control point 16 corresponding to the maximum and minimum positions of the projected substrate transfer robot 14 along the travel axis and the elevation axis when the projected obstacle interferes with the projected substrate transfer robot 14. In the present embodiment, the control point 16 corresponds to the center of the substrate W when the substrate is properly held by the hand 6.

If the coordinates of the points at which the projected obstacle 13 contacts the projected substrate transfer robot 14 are determined two-dimensionally as described above, the projected substrate transfer robot 14 cannot pass through a space above the projected obstacle 13 as can be seen from FIG. 4. However, when viewed three-dimensionally, the obstacle 9 may interfere only with the arm unit 5 of the substrate transfer robot. Therefore, contact positions are determined while checking a real (three-dimensional) state of interference. The contact positions that have been determined can be set in the controller as parameters, so that the interference region 12 can be defined in accordance with layouts.

Figure 5:
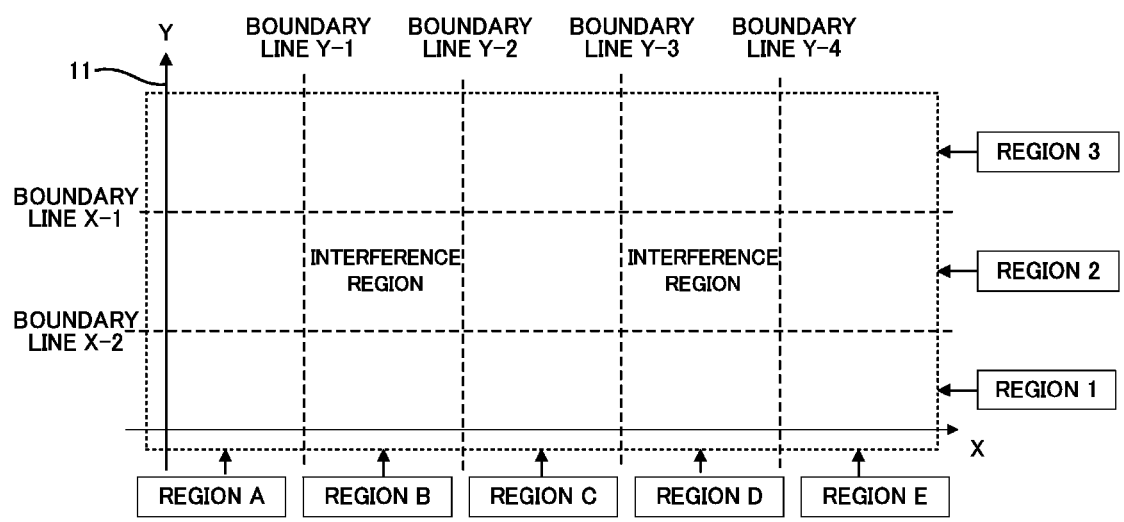
FIG. 5 shows the imaginary coordinate plane divided by an interference region.

Next, a method of determining whether the interference region 12 has been entered is described. In order to determine whether the interference region 12 has been entered, it is necessary to divide the imaginary coordinate plane 11 as described above. Upon defining the interference region 12, the imaginary coordinate plane 11 is divided as shown in FIG. 5 using extension lines of the sides of the interference region 12. In the case shown in FIG. 4, the imaginary coordinate plane is divided into nine regions. The present embodiment is described below with the assumption that, as shown in FIG. 5, the imaginary coordinate plane is divided into at most fifteen regions generated from X-direction regions A to E and Y-direction regions 1 to 3.

Among the regions generated by dividing the imaginary coordinate plane 11, a region including the starting position of a movement of the substrate transfer robot to be made and a region including the target position of the movement (hereinafter referred to as a starting region and a target region) are determined. Using a positional relationship among the starting region, the target region, and the pre-defined interference region 12, whether the interference region 12 has been entered is determined.

First, it is checked which of the patterns shown in FIGS. 6A to 9D the disposition of a starting position, a target position, and an interference region matches.

FIGS. 6A to 6D show examples of a pattern 1 in which a starting region and a target region are disposed on adjacent sides of an interference region in the imaginary coordinate plane.

FIGS. 7A to 7D show examples of a pattern 2 in which a starting region and a target region are disposed on opposite sides of an interference region in the imaginary coordinate plane.

FIG. 8A to 8D show examples of a pattern 3 in which a starting region and a target region are disposed on the extension of a diagonal line of an interference region in the imaginary coordinate plane.

FIG. 9A to 9D show examples of a pattern 4 in which a starting region and a target region are disposed on opposite sides of different interference regions in the imaginary coordinate plane.

If a movement to be made matches one of the four patterns, it is determined that the obstacle may interfere with the substrate transfer robot, and the substrate transfer robot makes an interference avoidance movement. If the movement does not match any of the patterns, it is determined that the obstacle does not interfere with the substrate transfer robot, and the substrate transfer robot linearly moves from the starting position to the target position. Thus, whether the interference region is entered is determined by a simple pattern identification process, which is shown in FIG. 10.

Figure 10A:
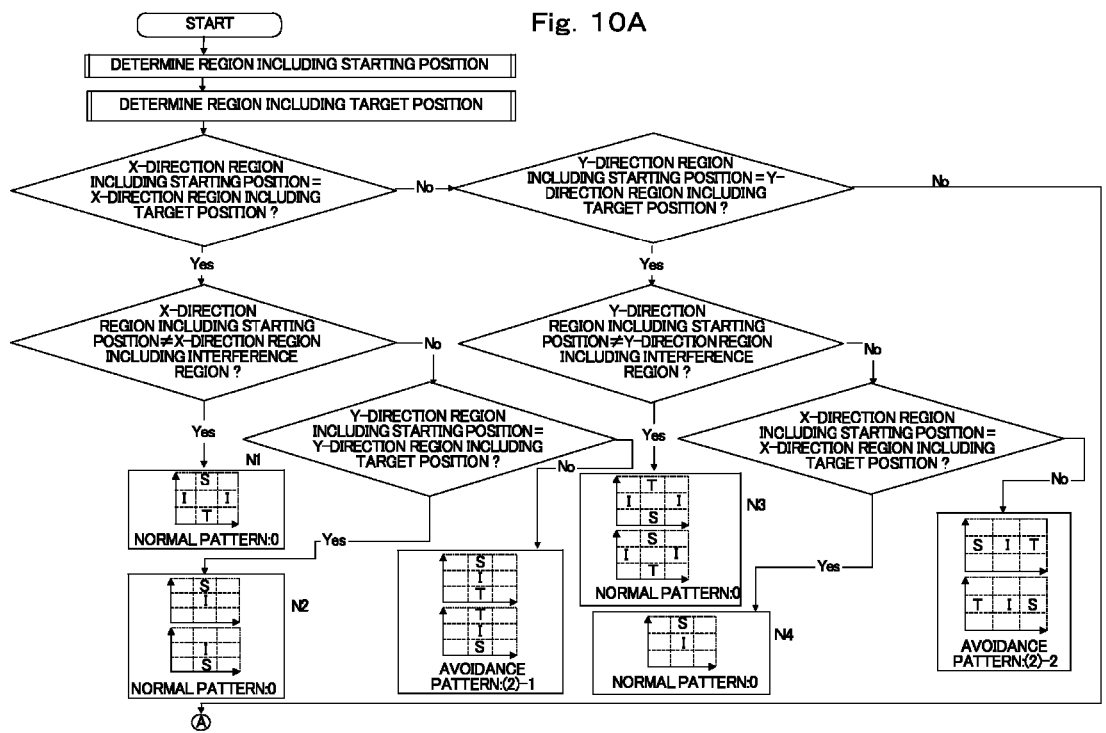
FIG. 10 is a flowchart showing a process of determining whether or not to perform an interference avoidance movement according to an embodiment of the present invention.
Figure 10B:
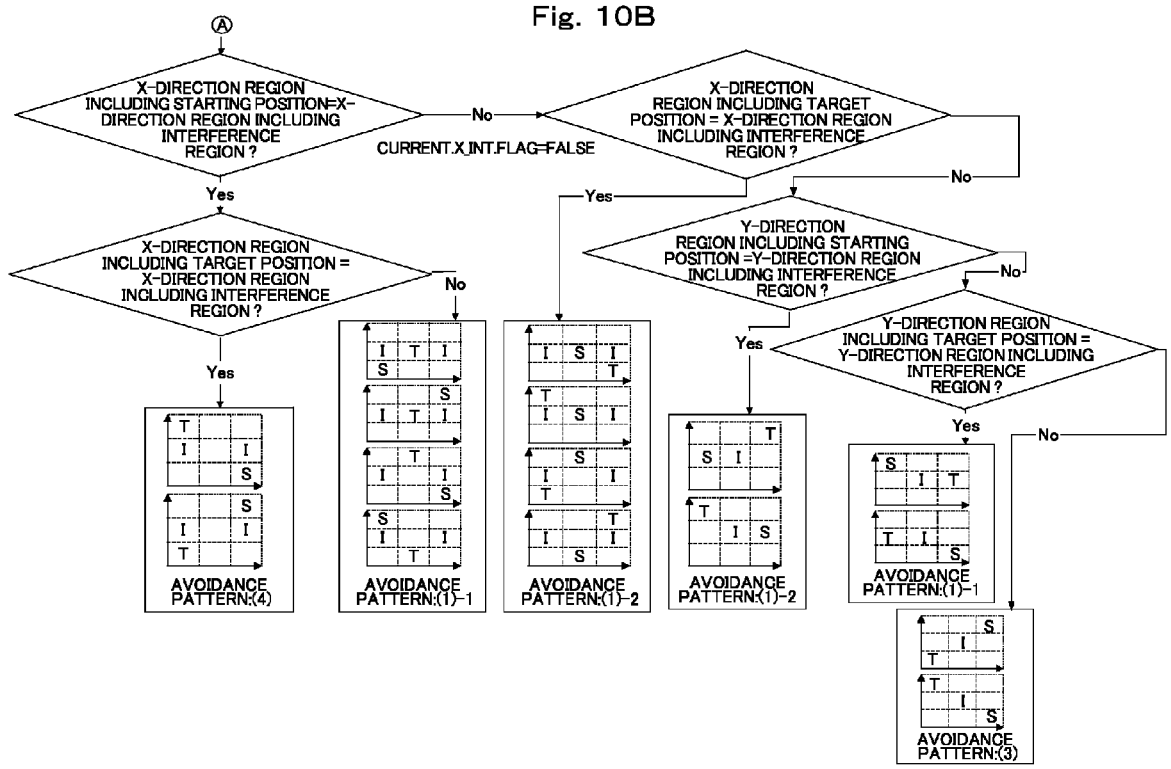

The flowchart of FIG. 10 is explained below. To start the pattern identification process, the starting position and the target position of the movement in the imaginary coordinate plane 11 are determined (determination of the starting region and the target region). At this time, using the regions made by dividing the imaginary coordinate plane (see FIG. 5), which regions include the starting position and the target position are determined. Information concerning which of the X-direction regions A to E and which of the Y-direction regions 1 to 3 include the starting position and the target position is input to the controller. On the basis of the information, an avoidance pattern is identified as described below.

Next, an X-direction region (one of the regions A to E) including the starting position is compared with an X-direction region including the target position. If the starting point and the target point are included in the same X-direction region, whether the X-direction region includes the interference region is checked.

If the X-direction region does not include the interference region, the substrate transfer robot can linearly move from the starting position to the target position, and it is determined that interference avoidance is not necessary (N1 shown in FIG. 10).

If the X-direction region includes the interference region, comparison of Y-direction regions (the regions 1 to 3) is performed. If the starting position and the target position are included in the same Y-direction region, the starting position and the target position are included in the same region in terms of both X and Y, and it is determined that interference avoidance is not necessary (N2 shown in FIG. 10). If the starting position and the target position are included in different Y-direction regions, it is determined that an interference avoidance movement of an avoidance pattern (2)-1 (see FIGS. 7A and 7B) is necessary.

If the starting position and the target position are included in different X-direction regions, whether the starting position and the target position are included in the same Y-direction region is checked in the next step. If the starting position and the target position are included in the same Y-direction region, whether the Y-direction region includes the interference region is checked.

If the Y-direction region does not include the interference region, the substrate transfer robot can linearly move from the starting position to the target position, and it is determined that interference avoidance is not necessary (N3 shown in FIG. 10).

If the Y-direction region includes the interference region, comparison of X-direction regions is performed. If the starting position and the target position are included in the same X-direction region, the starting position and the target position are included in the same region in terms X and Y, and it is determined that interference avoidance is not necessary (N4 in FIG. 10). If the Y-direction region does not include the interference region, it is determined that an interference avoidance movement of an avoidance pattern (2)-2 (see FIGS. 7C and 7D) is necessary.

If the starting position and the target position are included in different regions in terms of both X and Y, whether the starting position and the interference region are included in the same X-direction region is determined in the next step. If the starting position and the interference are included in the same X-direction region, whether the target position and the interference region are included in the same X-direction region is determined in the next step. If the target position and the interference region are included in the same X-direction region, it is determined from the preceding determination that an interference avoidance movement of an avoidance pattern 4 (see FIGS. 9A to 9D) is necessary. If the target position and the interference region are included in different X-direction regions, it is determined that an interference avoidance movement of an avoidance pattern (1)-1 (see FIGS. 6A and 6B) is necessary.

If the starting position and the target position are included in different regions in terms of both X and Y, and the starting position and the interference regions are included in different X-direction regions, whether the target position and the interference region are included in the same X-direction region is checked in the next step. If the target position and the interference region are included in the same X-direction region, it is determined from the preceding determination that an interference avoidance movement of an avoidance pattern (1)-2 (see FIGS. 6C and 6D) is necessary. If the target position and the interference region are included in different X-direction regions, whether the starting position and the interference regions are included in the same Y-direction region is checked. If the starting position and the interference regions are included in the same Y-direction region, it is determined from the preceding determination that an interference avoidance movement of the avoidance pattern (1)-2 (see FIGS. 6C and 6D) is necessary. If the starting position and the interference region are included in different Y-direction regions, whether the target position and the interference region are included in the same Y-direction region is checked. If the target position and the interference region are included in the same Y-direction region, it is determined that an interference avoidance movement of an avoidance pattern (1)-1 (see FIGS. 6A and 6B) is necessary. If the target position and the interference region are included in different Y-direction regions, it is determined that an interference movement of an avoidance pattern 3 (see FIGS. 8A to 8D) is necessary.

Next, a method of generating an interference avoidance movement (path) that is used when a movement to be made matches one of the above-described patterns is described.

Figure 6A:
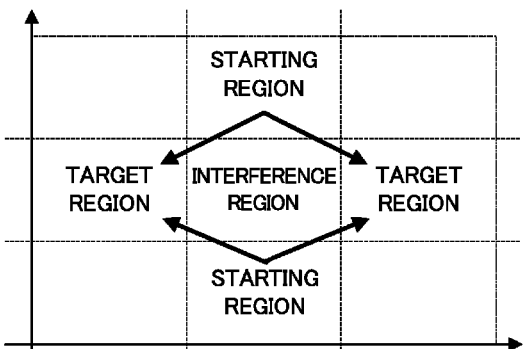
FIGS. 6A to 6D show examples of a pattern of a starting position, a target position, and an interference region in the imaginary coordinate plane.
Figure 6B:
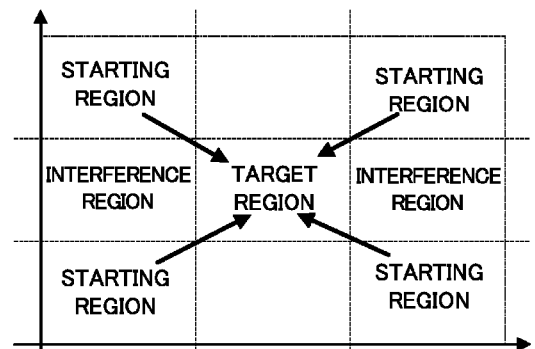
Figure 6C:
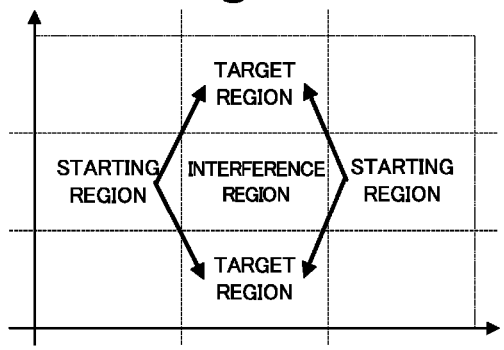
Figure 6D:
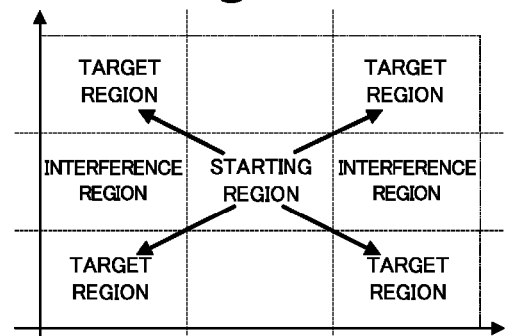
Figure 7A:
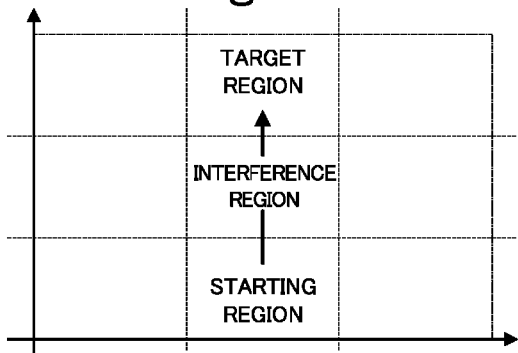
Figure 7B:
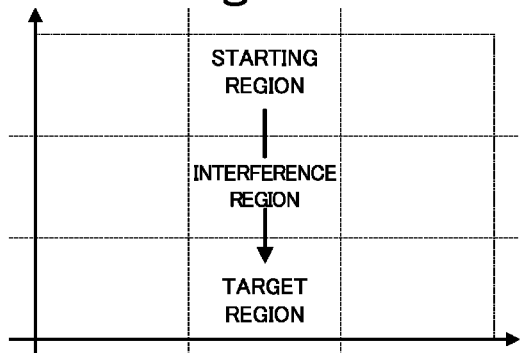
Figure 8A:
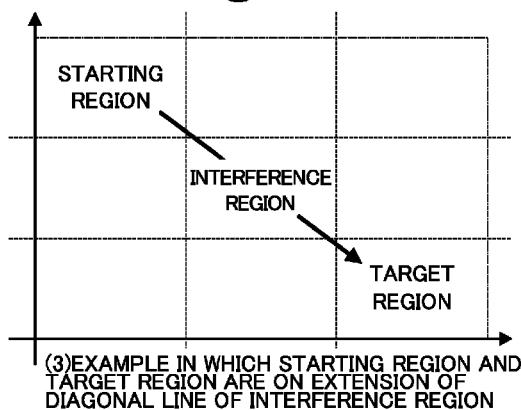
FIGS. 8A to 8D show examples of a pattern of a starting position, a target position, and an interference region in the imaginary coordinate plane.
Figure 8B:
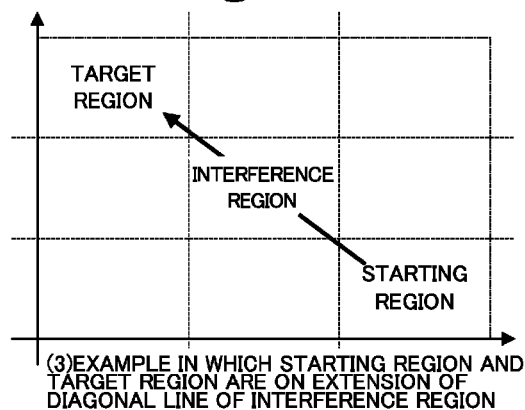
Figure 8C:
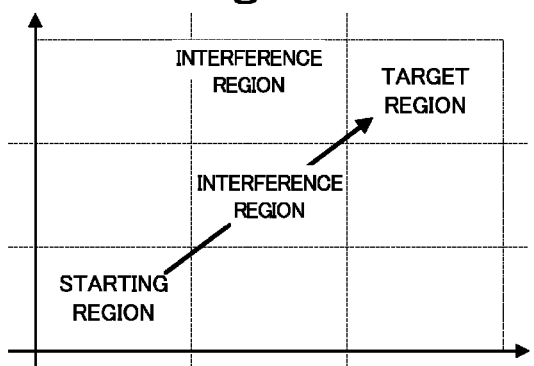
Figure 8D:
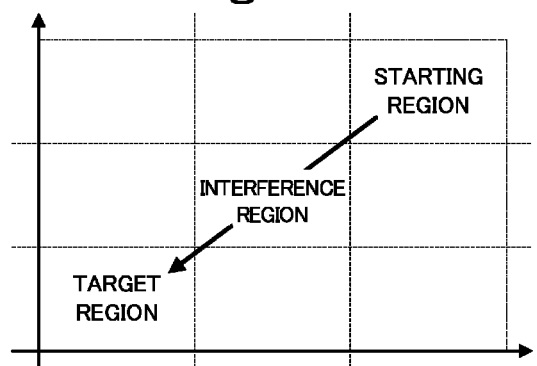
Figure 9A:
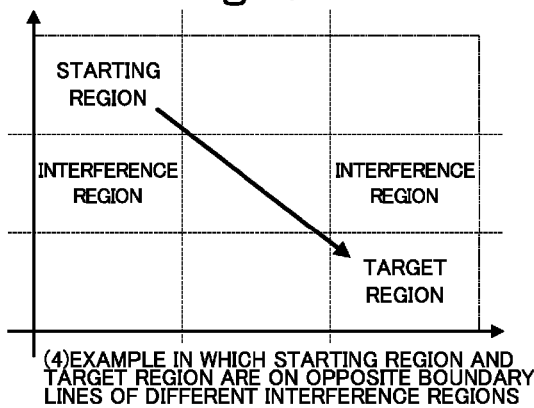
Figure 9B:
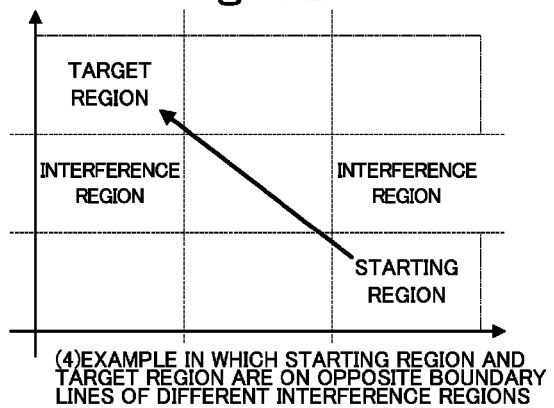
Figure 11A:
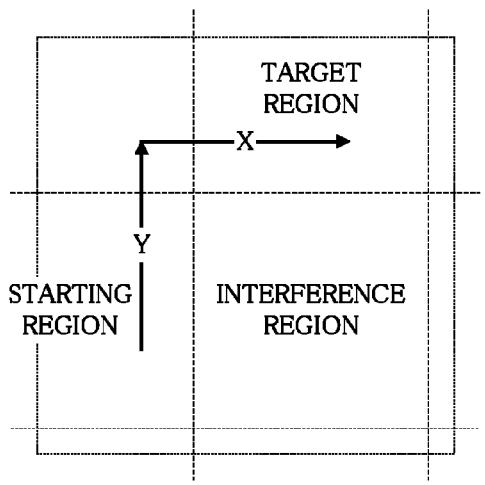
FIGS. 11A to 11D show a process of generating a path of an interference avoidance movement according to the embodiment of the present invention.

When an avoidance movement of the avoidance pattern (1)-1 shown in FIGS. 6A and 6B is performed, the interference region can be avoided by driving a drive axis corresponding to the Y-axis of the imaginary coordinate plane and then driving a drive axis corresponding to the X-axis, as shown by a basic path (1)-$a$ in FIG. 11A. However, the movement has to be temporarily stopped when the direction of the movement is switched from the Y direction to the X direction. Moreover, since the path is not the shortest path between the starting position and the target position, throughput is decreased. (The same applies to other avoidance patterns.)

Figure 11B:
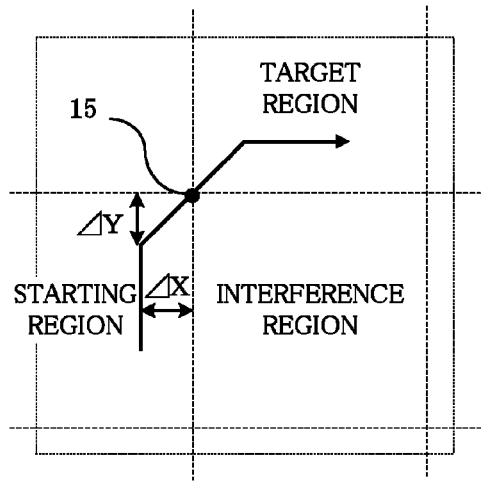
Figure 11C:
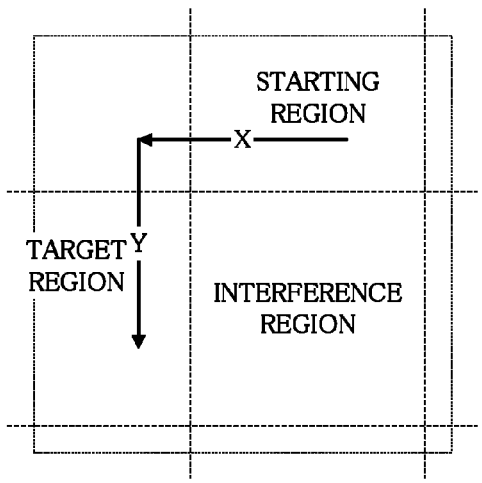

Therefore, as shown by a basic path (1)-$b$ in FIG. 11B, a movement along a drive axis corresponding to the Y-axis and a movement along a drive axis corresponding to the X-axis are combined. This is achieved by starting a movement along a drive axis corresponding to the Y-axis, and then, while the movement is being maintained, by starting a movement along a drive axis corresponding to the X-axis. By adjusting the timing for starting the second movement, interference between the obstacle and the substrate transfer robot can be prevented and the substrate transfer robot can be controlled to move along the shortest path. In contrast to existing techniques, a path passing though vertices of an interference region is not calculated beforehand. Instead, a movement path is determined by a timing at which a movement along the second drive axis is started. Thus, according to the present invention, the substrate transfer robot can move along a path that can avoid an interference region within the shortest time. The method of determining the start timing is different in accordance with patterns of the interference avoidance movement. Hereinafter, the method is described for each interference avoidance movement pattern.

In the case of the avoidance pattern (1)-1, as shown in FIG. 11B (basic path (1)-$b$), an X-direction distance ($\Delta X$) from a starting position to an X-direction-region boundary line that the substrate transfer robot passes through when the robot moves from the starting position to a target position is first calculated. The boundary line, which is one of the lines that divide the imaginary coordinate plane, is calculated when the imaginary coordinate plane is divided. If the starting position is in the negative X direction of the target position, an X-direction-region boundary line on the negative X side of the region including the target position is used to determine the timing. On the other hand, if the starting position is in the positive X direction of the target position, an X-direction-region boundary line on the positive side of the region including the target position is used to determine the timing. The distance ($\Delta X$) is calculated from the X coordinates of the starting position and the boundary line.

Next, an X-axis travel time (Tx) in which the drive axis corresponding to the X-axis moves the distance ($\Delta X$) is calculated from a predetermined movement speed and a movement pattern.

Likewise, a Y-direction distance ($\Delta Y$) that the drive axis corresponding to the Y-axis moves in the X-axis travel time (Tx) is calculated from a predetermined movement speed and a movement pattern.

FIG. 11B (basic path (1)-$b$) shows a path along which a movement is to be made. As the substrate transfer robot moves from the starting region to the target region along the path, the substrate transfer robot resultantly passes through a boundary point 15, which is one of the vertices of an interference region. For this purpose, using the data calculated as described above, the substrate transfer robot is moved from the starting position to the target position in the following manner. First, the drive axis corresponding to the Y-axis is moved. While maintaining the movement, when the substrate transfer robot reaches a position that is the Y-direction distance ($\Delta Y$) before a Y-direction-region boundary line that the robot passes through so as to reach the target position, the drive axis corresponding to the X-axis is driven. With this movement, a movement path of the substrate transfer robot according to the present invention resultantly passes through the boundary point 15. As a result, the substrate transfer robot can move along the shortest path that goes through a boundary point (at which interference does not occur) and at the maximum speeds of the drive axes.

Figure 11D:
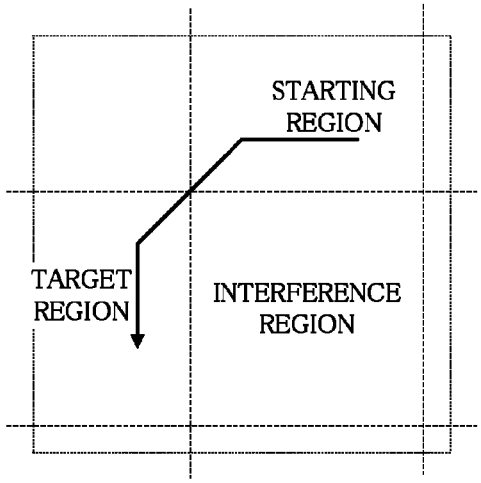

In the case of the avoidance pattern (1)-2, a path shown in FIG. 11D (basic path (1)-$d$) can be provided by performing an avoidance movement in the same manner as the above-described avoidance pattern (1)-1.

Figure 12A:
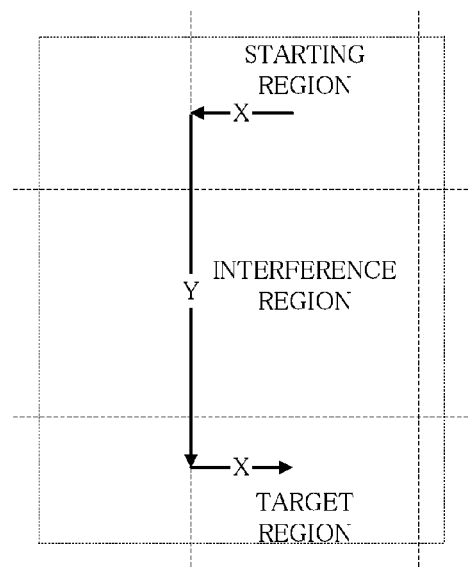
FIGS. 12A to 12D show a process of generating a path of an interference avoidance movement according to the embodiment of the present invention.
Figure 12B:
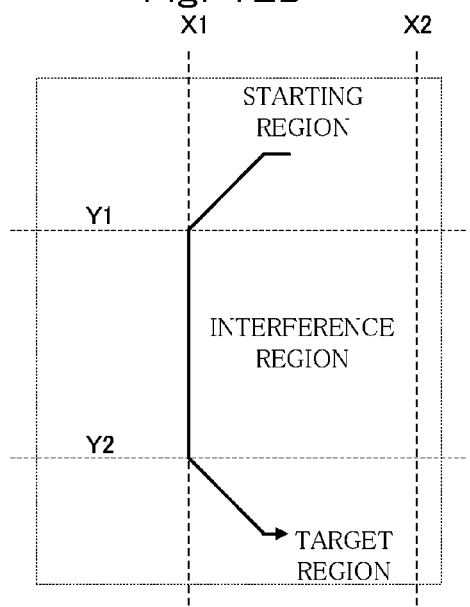
Figure 12C:
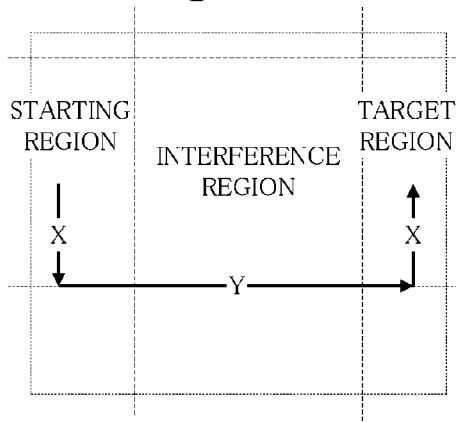

Next, in the case of the avoidance pattern (2)-1, as shown in FIG. 12B (basic path (2)-$b$), X-direction-region boundary lines X1 and X2 that the substrate transfer robot moving from the starting position to the target position may pass through are calculated. An X-direction-region boundary line on the positive X side of the interference region and an X-direction-region boundary line on the negative X side of the interference region are used to determine the timing. Next, whether the substrate transfer robot avoids the interference region clockwise or counterclockwise so as to move from the starting position to the target position is determined. This determination is made such that, by comparing a total distance from the starting position and the target position to an X-direction-region boundary line on the negative X direction side of the interference region and a total distance from the starting position and the target position to an X-direction-region boundary line on the positive X direction side of the interference region, a path with a smaller total distance is selected.

This selection determines an X-direction-region boundary line to be passed through. Next, a Y-direction distance ($\Delta Y$) to a first Y-direction-region boundary line Y1 that the substrate transfer robot moving from the starting position to the target position passes through is calculated. If the starting position is in the negative Y direction of the target position, a Y-direction-region boundary line on the positive side of the region including the starting position is the first Y-direction-region boundary line to be passed through. On the other hand, if the starting position is in the positive Y direction of the target position, a Y-direction-region boundary line on the negative side of the region including the starting position is the first Y-direction-region boundary line to be passed through. The distance ($\Delta y$) is calculated from the y coordinates of the starting position and the boundary line. Then, a Y-axis travel time (Ty) in which the drive axis corresponding to the Y-axis moves the distance ($\Delta Y$) is calculated from a predetermined movement speed and a movement pattern.

Next, an X-direction distance ($\Delta X$) that the drive axis corresponding to the X-axis moves in the Y-axis travel time (Ty) is calculated from a predetermined movement speed and a movement pattern.

FIG. 12B (basic path (2)-$b$) shows a path along which a movement is to be made. As the substrate transfer robot moves from the starting region to the target region on the path, the substrate transfer robot resultantly passes through two boundary points, which are among the vertices of an interference region. For this purpose, using the data calculated as described above, the substrate transfer robot is moved from the starting position to the target position in the following manner. First, the drive axis corresponding to the X-axis is moved toward the selected X-direction-region boundary line.

While maintaining the movement, when the substrate transfer robot reaches a position that is the X-direction distance ($\Delta X$) before an X-direction-region boundary line that the robot passes through so as to reach the target position, the drive axis corresponding to the Y-axis is driven. Then, the substrate transfer robot approaches the target position along the X-direction-region boundary line. When the robot reaches a second Y-direction-region boundary line to be passed, the drive axis corresponding to the X-axis is driven so as to move the robot from the X-direction-region boundary line to the target position.

As a result, the substrate transfer robot moves along a path shown in FIG. 12B (basic path (2)-$b$) to the target position along the shortest path and at the maximum speeds of the driving axes.

Figure 12D:
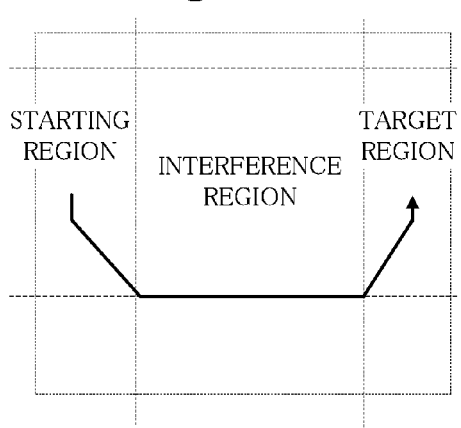

In the case of the avoidance pattern (2)-2, a path shown in FIG. 12D (basic path (2)-$d$) can be provided by performing an avoidance movement in the same manner as the above-described avoidance pattern (2)-1.

Figure 13A:
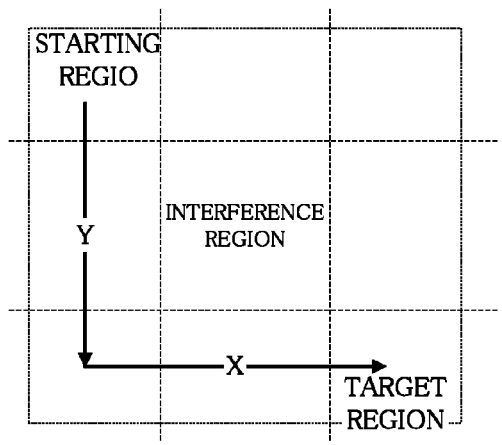
Figure 13B:
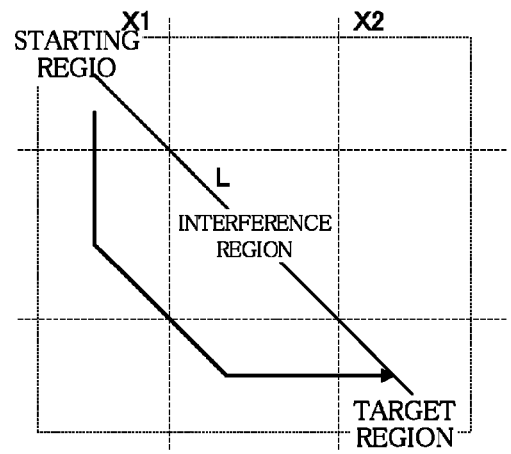

Next, in the case of an avoidance pattern (3), as shown in FIG. 13B (basic path (3)-$b$), X-direction-region boundary lines X1 and X2 that the substrate transfer robot moving from the starting position to the target position passes through are calculated. If the starting position is in the negative X direction of the target position, an X-direction-region boundary line on the positive X side of the region including the starting position and an X-direction-region boundary line on the negative X side of the target position are used to determine the timing. On the other hand, if the starting position is in the positive X direction of the target position, an X-direction-region boundary line on the negative X side of the region including the starting position and an X-direction-region boundary line on the positive X side of the region including the target position are used to determine the timing.

Next, an order in which the drive axis corresponding to the X-axis and the drive axis corresponding to the Y-axis are driven when the substrate transfer robot moves from the starting position to the target position is determined. This is determined from a positional relationship between the starting position and the target position with respect to a diagonal line L connecting the vertices of the interference region closest to the starting region and the target region.

If the starting position and the target position are on the negative side of the diagonal line L with respect to the X and Y coordinates, an order in which the drive axes are started is selected among driving orders-1 shown in FIG. 13C in accordance with a positional relationship between the starting position and the target position.

If the starting position and the target position are on the positive side of the diagonal line L with respect to the X and Y coordinates, an order in which the drive axes are started is selected among driving orders-2 shown in FIG. 13D in accordance with a positional relationship between the starting position and the target position.

In other cases, an order in which the drive axes are driven is selected among driving orders-3 shown in FIG. 13E by comparing the distance between the diagonal line L and the starting position and the distance between the diagonal line L and the target position.

If the drive axis corresponding to the X-axis is to be driven secondly, a distance from the starting position to an X-direction-region boundary line of a region including the starting position is calculated. Next, an X-axis travel time in which the drive axis corresponding to the X-axis moves the distance is calculated from a predetermined movement speed and a movement pattern. Next, a Y-direction distance that the drive axis corresponding to the Y-axis moves in the X-axis travel time is calculated from a predetermined movement speed and a movement pattern.

FIG. 13B (basic path (3)-b) shows a path along which a movement is to be made. As the substrate transfer robot moves from the starting region to the target region along the path, the substrate transfer robot resultantly passes through a boundary point, which is one of the vertices of an interference region. For this purpose, using the data calculated as described above, the substrate transfer robot is moved from the starting position to the target position in the following manner. First, the drive axis corresponding to the Y-axis is driven. While maintaining the movement, when the substrate transfer robot reaches a position that is the Y-direction distance before a Y-direction-region boundary line that the robot passes through so as to reach the target position, the drive axis corresponding to the X-axis is driven. As a result, a movement path resultantly passes through a boundary point.

In a similar manner, if the drive axis corresponding to the Y-axis is to be driven secondly, a distance from the starting position to a Y-direction-region boundary line of a region including the starting position is calculated. Next, a Y-axis travel time in which the drive axis corresponding to the Y-axis moves the distance is calculated from a predetermined movement speed and a movement pattern. Next, an X-direction distance that the drive axis corresponding to the X-axis moves in the Y-axis travel time is calculated from a predetermined movement speed and a movement pattern. Using data calculated as described above, the substrate transfer robot is moved as described above.

Figure 14A:
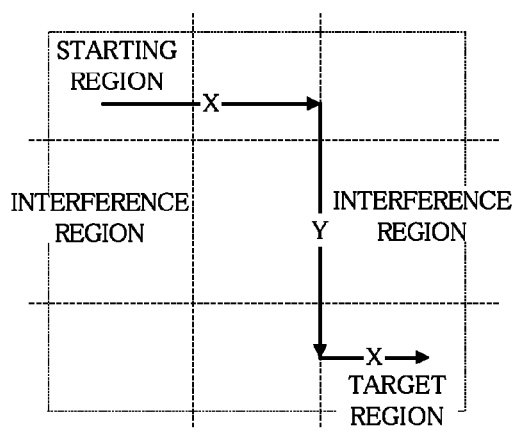
FIGS. 14A and 14B show a process of generating an interference avoidance path of an interference avoidance movement according to the embodiment of the present invention.
Figure 14B:
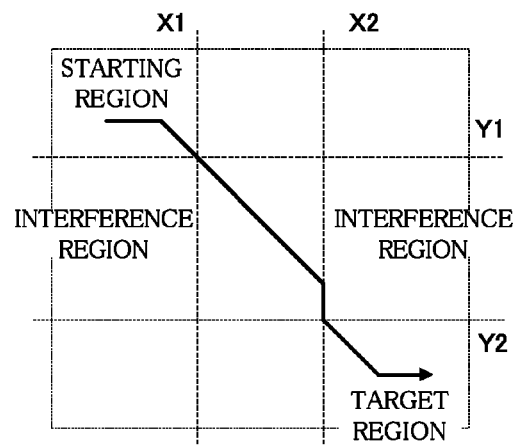

Next, in the case of an avoidance pattern (4), as shown in FIG. 14B (basic path (4)-b), X-direction-region boundary lines X1 and X2 and Y-direction-region boundary lines Y1 and Y2 that the substrate transfer robot moving from the starting position to the target position passes through are calculated. If the starting position is in the negative X direction of the target position, an X-direction-region boundary line X2 on the negative X side of the region including the target position and an X-direction-region boundary line X1 next to the X-direction-region boundary line X2 in the negative X direction are used to determine the timing. On the other hand, if the starting position is in the positive X direction of the target position, an X-direction-region boundary line on the positive X side of the region including the target position and an X-direction-region boundary line next to the X-direction-region boundary line are used to determine the timing. A Y-direction-region boundary line Y1 on the positive Y side of the interference region and a Y-direction-region boundary line Y2 on the negative Y side of the interference region are used to determine the timing.

In the case of the avoidance pattern (4), the drive axis corresponding to the X-axis is the first drive axis, the drive axis corresponding to the Y-axis is the second drive axis, and the drive axis corresponding to the X-axis is the third drive axis. A timing at which the second drive axis is moved while the first drive axis is in motion, and a timing at which the third drive axis is moved while the second drive axis is in motion are determined as described below.

A Y-direction distance between the starting position and a Y-direction-region boundary line Y1 that the substrate transfer robot first passes through is calculated. Next, a Y-axis travel time in which the drive axis corresponding to the Y-axis moves the distance is calculated from a predetermined movement speed and a movement pattern. Next, an X-direction distance that the drive axis corresponding to the X-axis moves in the Y-axis travel time is calculated.

FIG. 14B (basic path (4)-b) shows a path along which a movement is to be made. As the substrate transfer robot moves from the starting region to the target region along the path, the substrate transfer robot resultantly passes through a boundary point, which is one of the vertices of an interference region. For this purpose, using the data calculated as described above, the substrate transfer robot is moved from the starting position to the X-direction-region boundary line X2 in the following manner. When the substrate transfer robot reaches a position that is the X-direction distance before the X-direction-region boundary line X1 that the robot first passes through, the drive axis corresponding to the Y-axis is driven. Next, when the substrate transfer robot reaches the X-direction-region boundary line X2 and the Y-direction-region boundary line Y2, from the time when the substrate transfer robot passes through the Y-direction-region boundary line Y2, the drive axis corresponding to the X-axis is driven so that the substrate transfer robot moves the X-direction distance between the X direction boundary line X2 to the target position.

Accordingly, the substrate transfer robot can move along a path shown in FIG. 14B (basic path (4)-b) to the target position along the shortest path and at the maximum speeds of the drive axes.

Next, a function including the above-described interference avoidance function and further including a function of switching between an interference region when the substrate transfer robot holds a substrate and an interference region when the substrate transfer robot does not hold a substrate is described. As shown in FIGS. 1B and 1C, the minimum rotation diameter of the substrate transfer robot when the robot holds a substrate may be different from that when the robot does not hold a substrate. Thus, in the interference avoidance function described above, an interference region may be generated in different sizes.

Figure 15:
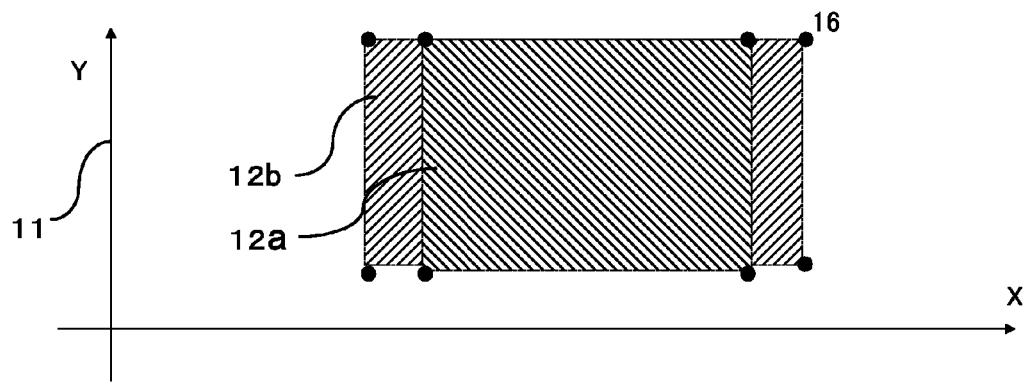
FIG. 15 shows an interference region with a substrate and an interference region without a substrate in an imaginary coordinate plane having an elevation axis and a travel axis.

FIG. 15 shows a concept of interference avoidance using an imaginary coordinate plane having an elevation axis and a travel axis of a substrate transfer robot. FIG. 15, which is similar to FIG. 4, shows an imaginary coordinate plane having an X-axis, which is a projection of a travel axis, and a Y-axis, which is a projection of an elevation axis. Interference regions 12a and 12b are shown by shaded areas in an imaginary coordinate plane 11. The interference region 12a is generated from a projected substrate transfer robot 14a, which is a projection of the minimum rotation diameter without a substrate A of the substrate transfer robot, and a projected obstacle 13. The interference region 12b is generated from a projected substrate transfer robot 14b, which is a projection of the minimum rotation diameter with a substrate A of the substrate transfer robot, and the projected obstacle 13. As shown in FIG. 15, the interference region 12a is smaller than the interference region 12b.

With the substrate transfer robot having this function, the controller stores the two interference regions 12a and 12b when the interference regions are generated. When the substrate transfer robot moves from the starting position to the target position, the presence/absence of a substrate is detected by a sensor attached to the substrate transfer robot itself, a hand of the substrate transfer robot, or a semiconductor manufacturing apparatus, and information regarding the presence/absence is provided to the controller. The substrate transfer robot performs an interference avoidance movement of one of the avoidance patterns described above using one of the interference regions 12a and 12b (by switching between the regions). Thus, when the hand does not hold a substrate, the substrate transfer robot can perform an avoidance movement along a shorter path.

According to the embodiment of the present invention described above, if there is an obstacle in the range of motion of a substrate transfer robot, the position of the obstacle is represented as a region within the range of motion of the substrate transfer robot, so that whether the obstacle is on a path of the substrate transfer robot moving from a starting position to a target position is readily determined by pattern identification. If the interference region interferes with the movement of the substrate transfer robot from the starting position to the target position, the substrate transfer robot can avoid the obstacle within the shortest time. Moreover, according to an embodiment of the present invention, in accordance with a state regarding the presence/absence of a substrate obtained with an external sensor, an interference region appropriate for the state can be selected, so that an optimal avoidance movement is performed.

What is claimed is:

1. A substrate transfer robot comprising:
   a hand for holding a substrate and movable between a plurality of taught positions that have been taught beforehand so as to transfer the substrate;
   a controller programmed to:
      set an interference region in advance in a range of motion of the substrate transfer robot;
      store a plurality of patterns of a combination of a starting position, a target position, and the interference region, the starting position and the target position being among the plurality of taught positions; and
      determine which pattern among the plurality of patterns a movement of the substrate transfer robot from the starting position to the target position matches when the substrate transfer robot moves between the plurality of taught positions,
   wherein the controller is programmed to perform an avoidance movement from the starting position to the target position so as to avoid the interference region in accordance with the determined pattern,
   wherein the controller is programmed to store the interference region for a case when the substrate transfer robot holds the substrate and the interference region for a case when the substrate transfer robot does not hold the substrate, and
   wherein the controller is programmed to determine the pattern by switching between the interference region for the case when the substrate transfer robot holds the substrate and the interference region for the case when the substrate transfer robot does not hold the substrate so as to determine which of the patterns the movement matches.

2. The substrate transfer robot according to claim 1, wherein the controller is programmed to set the interference region in an imaginary coordinate plane having two coordinate axes corresponding to two axes among a plurality of drive axes of the substrate transfer robot.

3. The substrate transfer robot according to claim 2, wherein the interference region is determined from a region in which a projection of an obstacle existing in the range of motion of the substrate transfer robot and a projection of the substrate transfer robot overlap, the projections being set as rectangular regions in the imaginary coordinate plane.

4. The substrate transfer robot according to claim 1, wherein the controller is programmed to form the pattern by storing segmented regions generated by extending boundary lines on sides of the interference region having a rectangular shape.

5. The substrate transfer robot according to claim 4, wherein the controller is programmed to determine the segmented regions in which the starting position and the target position are included so as to determine which of the patterns the movement matches.

6. The substrate transfer robot according to claim 2, wherein, in order to perform the avoidance movement by driving the two drive axes corresponding to an X-axis and a Y-axis of the imaginary coordinate plane, one of the two drive axes is driven first, and subsequently the other one of the two drive axes is driven at a predetermined timing.

7. The substrate transfer robot according to claim 1, wherein the hand of the substrate transfer robot includes a sensor and discriminates between the cases when the substrate transfer robot holds the substrate and when the substrate transfer robot does not hold the substrate by detecting whether or not the hand holds the substrate using the sensor.

8. A substrate transfer apparatus comprising:
   a substrate transfer robot having a hand for holding a substrate and movable between a plurality of taught positions that have been taught beforehand so as to transfer the substrate, the substrate transfer robot including:
      a controller programmed to:
         set an interference region in advance in a range of motion of the substrate transfer robot;
         store a plurality of patterns of a combination of a starting position, a target position, and the interference region, the starting position and the target position being among the plurality of taught positions; and
         determine which pattern among the plurality of patterns a movement of the substrate transfer robot from the starting position to the target position matches when the substrate transfer robot moves between the plurality of taught positions,
      wherein the controller is programmed to perform an avoidance movement from the starting position to the target position so as to avoid the interference region in accordance with the determined pattern,
      wherein the controller is programmed to store the interference region for a case when the substrate transfer robot holds the substrate and the interference region for a case when the substrate transfer robot does not hold the substrate, and
      wherein the controller is programmed to determine the pattern by switching between the interference region for the case when the substrate transfer robot holds the substrate and the interference region for the case when the substrate transfer robot does not hold the substrate so as to determine which of the patterns the movement matches; and
   a substrate container containing the substrate.

9. A semiconductor manufacturing apparatus comprising:
   a substrate transfer robot having a hand for holding a substrate and movable between a plurality of taught positions that have been taught beforehand so as to transfer the substrate, the substrate transfer robot including:
      a controller programmed to:
         set an interference region in advance in a range of motion of the substrate transfer robot;
         store a plurality of patterns of a combination of a starting position, a target position, and the interference region, the starting position and the target position being among the plurality of taught positions; and
         determine which pattern among the plurality of patterns a movement of the substrate transfer robot from the starting position to the target position matches when the substrate transfer robot moves between the plurality of taught positions, wherein the controller is programmed to perform an avoidance movement from the starting position to the target position so as to avoid the interference region in accordance with the determined pattern, wherein the controller is programmed to store the interference region for a case when the substrate transfer robot holds the substrate and the interference region for a case when the substrate transfer robot does not hold the substrate, and wherein the controller is programmed to determine the pattern by switching between the interference region for the case when the substrate transfer robot holds the substrate and the interference region for the case when the substrate transfer robot does not hold the substrate so as to determine which of the patterns the movement matches;

a substrate container containing the substrate; and a processing device for processing the substrate transferred from the substrate container by the substrate transfer robot.

10. A method of causing a substrate transfer robot to avoid an obstacle existing in a range of motion of the substrate transfer robot, the substrate transfer robot having a hand for holding a substrate and movable between a plurality of taught positions that have been taught beforehand so as to transfer the substrate, the method comprising the steps of:

setting an interference region in advance in the range of motion of the substrate transfer robot;

storing a plurality of patterns of a combination of a starting position, a target position, and the interference region, the starting position and the target position being among the plurality of taught positions;

determining which pattern among the plurality of patterns a movement of the substrate transfer robot from the starting position to the target position matches when the substrate transfer robot moves between the plurality of taught positions; and performing an avoidance movement from the starting position to the target position so as to avoid the interference region in accordance with the pattern determined by the pattern determining means, wherein the step of setting the interference region includes setting the interference region for a case when the hand of the substrate transfer robot holds the substrate and for a case when the hand of the substrate transfer robot does not hold substrate, and wherein, in the step of determining, switching between the interference regions for the case when the substrate transfer robot holds the substrate and for the case when the substrate transfer robot does not hold the substrate is performed so as to determine which of the patterns the movement matches, and wherein at least one of the steps is performed by a processor.

11. The substrate transfer robot according to claim 1, wherein the substrate transfer robot has a first range of motion for the case when the substrate transfer robot holds the substrate and a second range of motion for the case when the substrate transfer robot does not hold the substrate, and wherein the first range of motion differs from the second range of motion.

12. The substrate transfer apparatus according to claim 8, wherein the substrate transfer robot has a first range of motion for the case when the substrate transfer robot holds the substrate and a second range of motion for the case when the substrate transfer robot does not hold the substrate, and wherein the first range of motion differs from the second range of motion.

13. The semiconductor manufacturing apparatus according to claim 9, wherein the substrate transfer robot has a first range of motion for the case when the substrate transfer robot holds the substrate and a second range of motion for the case when the substrate transfer robot does not hold the substrate, and wherein the first range of motion differs from the second range of motion.

14. The method according to claim 10, wherein the substrate transfer robot has a first range of motion for the case when the substrate transfer robot holds the substrate and a second range of motion for the case when the substrate transfer robot does not hold the substrate, and wherein the first range of motion differs from the second range of motion.

* * * * *